US006894330B2

(12) United States Patent
Bachhofer et al.

(10) Patent No.: US 6,894,330 B2
(45) Date of Patent: May 17, 2005

(54) MEMORY CONFIGURATION AND METHOD FOR READING A STATE FROM AND STORING A STATE IN A FERROELECTRIC TRANSISTOR

(75) Inventors: Harald Bachhofer, München (DE); Georg Braun, München (DE); Thomas Peter Haneder, München (DE); Wolfgang Hönlein, Unterhaching (DE); Marc Ullmann, Hamburg (DE)

(73) Assignee: Infineon Technologies AG, Munich (DE)

( * ) Notice: Subject to any disclaimer, the term of this patent is extended or adjusted under 35 U.S.C. 154(b) by 332 days.

(21) Appl. No.: 09/783,187

(22) Filed: Feb. 14, 2001

(65) Prior Publication Data

US 2001/0017386 A1 Aug. 30, 2001

(30) Foreign Application Priority Data

Feb. 14, 2000 (DE) .......................................... 100 06 444

(51) Int. Cl.[7] .............................................. H01L 29/76
(52) U.S. Cl. ....................................... 257/295; 257/288
(58) Field of Search ............................... 257/288, 295, 257/315, 316; 365/145

(56) References Cited

U.S. PATENT DOCUMENTS 5,471,417 A    11/1995  Krautschneider et al.
5,946,224 A    8/1999   Nishimura
6,385,076 B1 * 5/2002   Fujimori .................... 365/145
2001/0038117 A1 11/2001 Haneder et al.

FOREIGN PATENT DOCUMENTS

| DE | 198 40 824 C1 | 10/1999 |
| JP | 08 263 988 A  | 10/1996 |
| KR | 229961        | 11/1999 |
| WO | WO 92/12518   | 7/1992  |

OTHER PUBLICATIONS

Takashi Nakamura et al.: "A Single–Transistor Ferroelectric Memory Cell", 1995 IEEE International Solid–State Circuits Conference, pp. 68–69.

Jong–Son Lyu et al.: "Metal–Ferroelectric–Semiconductor Field–Effect Transistor (MFSFET) for Single Transistor Memory by Using Poly–Si Source/Drain and $BaMgF_4$ Dielectric", IEDM 1996, pp. 503–506.

* cited by examiner

*Primary Examiner*—Roy Potter
(74) *Attorney, Agent, or Firm*—Laurence A. Greenberg; Werner H. Stemer; Ralph E. Locher (57) ABSTRACT

The state of a ferroelectric transistor in a memory cell is read or stored, and the threshold voltage of further ferroelectric transistors in further memory cells in the memory matrix is increased during the reading or storing, or is increased permanently. A memory configuration including ferroelectric memory cells is also provided.

8 Claims, 5 Drawing Sheets

MEMORY CONFIGURATION AND METHOD FOR READING A STATE FROM AND STORING A STATE IN A FERROELECTRIC TRANSISTOR

BACKGROUND OF THE INVENTION

Field of the Invention

The invention relates to a method for reading a state from a ferroelectric transistor of a memory cell or storing a state in a ferroelectric transistor of a memory cell. The invention also relates to a memory configuration including a memory matrix.

Such a method and such a memory matrix are described by T. Nakamura et al. in the article "A Single-Transistor Ferroelectric Memory Cell," IEEE International Solid-State Circuits Conference, ISSCC95, Session 4, Technology Directions: Displays, Photonics and Ferroelectric Memories, pages 68–69, 1995. This memory matrix is a matrix having a large number of memory cells, which each have a ferroelectric transistor. The ferroelectric transistors are connected to one another in the form of a square matrix. Furthermore, the memory matrix has a read/store control apparatus, through the use of which a state of a ferroelectric transistor in a memory cell in the memory matrix can be stored, or the current state of the corresponding ferroelectric transistor in the memory cell can be read.

According to the procedure described by T. Nakamura et al., when a state is stored, deleted or read in a ferroelectric transistor in a memory cell in the memory matrix, a corresponding read/store voltage is applied to the corresponding word lines or bit lines. The application of the required read/store voltage also influences further ferroelectric transistors which are located in adjacent positions in the memory matrix and are connected to the ferroelectric transistor whose state is to be stored or read. In this way, it is possible for the process of reading or storing a state of a ferroelectric transistor in the memory matrix to corrupt a state of a further ferroelectric transistor in the memory matrix, that is to say to inadvertently change this state.

As described by T. Nakamura et al., a read/write voltage of $V_{pp}/V_{rr}$ is applied to the ferroelectric transistor from which or in which a state is to be read or stored. In this case, an interference voltage or disturbance voltage of approximately $\pm V_{pp}/2$ or $\pm V_{pp}/3$ is applied to the adjacent further ferroelectric transistors which are connected to this ferroelectric transistor, and this can incorrectly change the state of the corresponding further ferroelectric transistor.

The problem will be explained in more detail with reference to FIG. 2.

Figure 2:
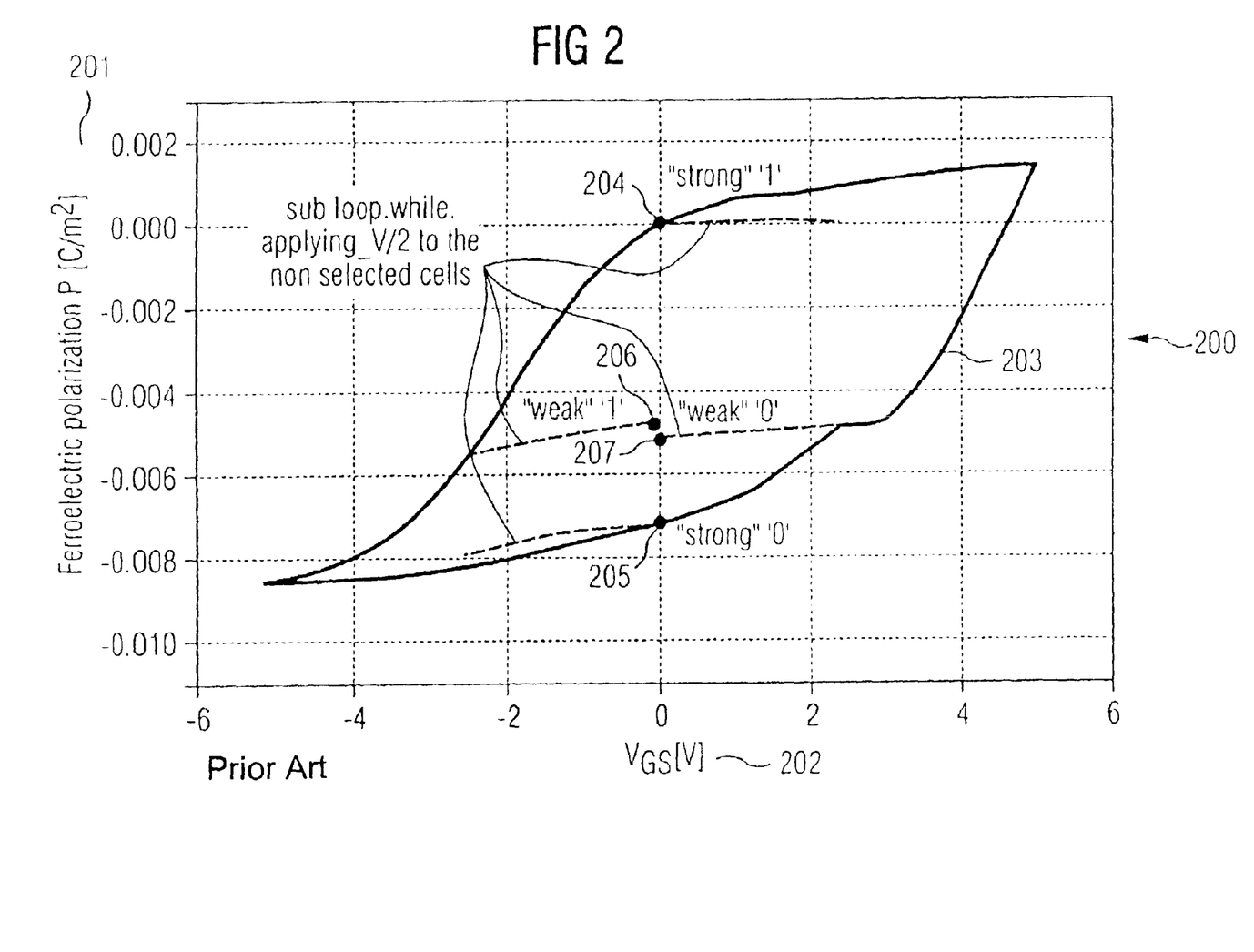
FIG. 2 is a graph illustrating a profile of the ferroelectric polarization in the gate of a usual ferroelectric transistor as a function of the applied gate voltage when reading or storing a state from or in the ferroelectric transistor according to the prior art.

FIG. 2 shows a diagram 200 with a profile of the ferroelectric polarization 201 in the gate of a ferroelectric transistor as a function of an applied gate voltage $V_{GS}$ 202. The diagram 200 shows the gate voltage 202 in volts ([V]) and the ferroelectric polarization 201 in coulombs/m² ([C/m²]).

The profile of the ferroelectric polarization 201 as a function of the gate voltage 202 is described by a hysteresis loop 203. As can be seen in FIG. 2, a conventional ferroelectric transistor has two stable polarization states, a first stable polarization state 204 and a second stable polarization state 205. By changing the applied gate voltage $V_{GS}$, in particular through the use of an "interference voltage" of $V_{pp}/2$ or $V_{pp}/3$ as described above, the state of the ferroelectric transistor can move along the hysteresis loop 203 to polarization states which cannot be distinguished electrically, namely to a first indistinguishable polarization state 206, and to a second indistinguishable polarization state 207.

While it is easily possible to distinguish the first distinguishable polarization state 204 electrically from the second distinguishable polarization state 205, whereby two different states can be provided and identified through the use of the ferroelectric transistor within the memory matrix, such a capability to electrically distinguish between states is not guaranteed or even impossible with the indistinguishable polarization states 206, 207.

Such an interference voltage can thus result in the state which is stored in adjacent further ferroelectric transistors in the memory matrix being changed, or at least becoming undefined, that is to say a polarization state is formed in the corresponding adjacent ferroelectric transistor which cannot be read reliably, that is to say cannot be distinguished electrically.

A further ferroelectric transistor and a method for its production are described by Jong-Son Lyu et al. in the article "Metal-Ferroelectric-Semiconductor Field-Effect Transistor (MFSFET) for Single Transistor Memory by Using Poly-Si Source/Drain and $BaMgF_4$ Dielectric," IEDM 1996, pages 503–506, 1996.

SUMMARY OF THE INVENTION

It is accordingly an object of the invention to provide a method for reading a state from a ferroelectric transistor or storing a state in the ferroelectric transistor which overcomes the above-mentioned disadvantages of the heretofore-known methods of this general type and which avoids that further ferroelectric transistors in further memory cells in the memory matrix are changed to an indistinguishable polarization state by the process of reading from or storing in a ferroelectric transistor. It is a further object of the invention to provide a corresponding memory configuration.

With the foregoing and other objects in view there is provided, in accordance with the invention, a method for reading a state from a ferroelectric transistor or storing a state in the ferroelectric transistor, the method includes the steps of:

providing, in a memory matrix, a memory cell with a ferroelectric transistor and further memory cells with further ferroelectric transistors;

reading a state from the ferroelectric transistor or storing a state in the ferroelectric transistor; and increasing a threshold voltage of at least one of the further ferroelectric transistors in the memory matrix.

In other words, in a method for reading or storing a state from a ferroelectric transistor in a memory cell, or for storing a state in a ferroelectric transistor in the memory cell which is provided in a memory matrix having a number of further memory cells with further ferroelectric transistors, the state is read from the ferroelectric transistor or is stored in the ferroelectric transistor. During the process of reading or storing the state of the ferroelectric transistor the threshold voltage of at least one further ferroelectric transistor in the memory matrix is increased, in particular by applying a drain-substrate voltage $V_{DS}$.

With the objects of the invention in view there is also provided, a memory configuration, including:

a memory matrix including a plurality of memory cells connected to one another, the memory cells including ferroelectric transistors such that at least some of the memory cells each include at least a respective one of the ferroelectric transistors;

a read/store control apparatus connected to the memory cells for controlling reading a state from one of the ferroelectric transistors or storing a state to the one of the ferroelectric transistors; and the read/store control apparatus being configured such that the state is read from the one of the ferroelectric transistors or stored in the one of the ferroelectric transistors, and such that a threshold voltage of at least a further one of the ferroelectric transistors in the memory matrix is increased.

In other words, a memory matrix has a number of memory cells which are connected to one another, with at least some of the memory cells having at least one ferroelectric transistor. Furthermore, the memory matrix has a read/store control apparatus, which controls the process of reading a state from a ferroelectric transistor in a memory cell in the memory matrix, or the process of storing a state in a ferroelectric transistor in a memory cell in the memory matrix. The read/store control apparatus is set up such that the state is read from the ferroelectric transistor or is stored in the ferroelectric transistor and, during the process of reading or storing the state of the ferroelectric transistor the threshold voltage of at least one further ferroelectric transistor in the memory matrix is increased, in particular by applying a drain-substrate voltage $V_{DS}$.

Increasing the threshold voltage of a further ferroelectric transistor protects that further ferroelectric transistor in such a way that it no longer changes to an indistinguishable polarization state.

As has been identified according to the invention, increasing the threshold voltage, in particular by application of a drain-substrate voltage $V_{DS}$ to a ferroelectric transistor, in each case results in the formation of a plateau in the hysteresis loop which describes the ferroelectric polarization profile. As is described further below, this plateau is sufficient to prevent a change to an indistinguishable polarization state as a result of a change to the gate voltage which is produced by reading or storing a state from or in an adjacent ferroelectric transistor.

This relates in particular to the region of the polarization profile in which the ferroelectric transistor is located when the applied gate voltage is in a depletion state of the charge carriers in the channel region of the ferroelectric transistor.

The invention thus allows to read or store a state reliably from or in a ferroelectric transistor in a memory matrix, without the states of further ferroelectric transistors which are adjacent in the memory matrix being changed to an undefined state, that is to say to an electrically indistinguishable state, which is to say without causing a fault in the further ferroelectric transistors.

The embodiments which are described in the following text relate both to the method and to the configuration of the read/store control apparatus, wherein, according to the corresponding embodiment, the read/store control apparatus in each case is set up to provide the corresponding improvement.

The corresponding embodiment of the read/store control apparatus can be implemented in software, through the use of a computer program which is provided in a memory in the read/store control apparatus and is executed through the use of a processor. The corresponding embodiment of the read/store control apparatus can also be implemented in hardware through the use of a specific electronic circuit.

A preferred embodiment of the invention provides for the state to be read from the ferroelectric transistor or to be stored in the ferroelectric transistor by applying a read/store voltage to the gate electrode of the ferroelectric transistor in order to read or store the state.

Furthermore, the threshold voltage of a further ferroelectric transistor can be increased by applying a drain-substrate voltage to the further ferroelectric transistor in the memory matrix. The drain-substrate voltage $V_{DS}$ may be a constant voltage of approximately $V_{DS}=\pm 3.3$ V, depending on the type of ferroelectric transistor (+3.3 V for an n-channel ferroelectric transistor, −3.3 V for a p-channel ferroelectric transistor).

A number of transistors, in particular a number of ferroelectric transistors, can be used in a memory cell in the memory matrix.

Even if a ferroelectric transistor which has been produced using a specific method is used in the further exemplary embodiment, any desired further ferroelectric transistor may, however, be used in an alternative embodiment within the scope of the invention.

For example, in particular, different materials may be used for the dielectric intermediate layer (in particular having a thickness of between approximately 3 nm and 25 nm) of the ferroelectric transistor. The materials may include, for example, cerium oxide $CeO_2$, zirconium oxide $ZrO_2$, titanium oxide $TiO_2$, tantalum oxide $TaO_2$ or dialuminum oxide $AlO_2O_3$.

BMF ($BaMgF_4$), PZT ($(PbZr)TiO_3$) or SBT ($SrBi_2Ta_2O_9$) may be used, for example, as the ferroelectric layer. The ferroelectric layer has a thickness of between about 30 nm and 300 nm.

Furthermore, the invention can also be used with a p-channel ferroelectric transistor, although, in the further exemplary embodiment, the invention is described with reference to an n-channel ferroelectric transistor. In this case, all that is necessary is to reverse the polarity of the voltages to be applied in a corresponding manner.

A number of electrical intermediate layers can also be provided within a ferroelectric transistor, being composed of one or more of the materials described above.

In general, any desired perovskite may be used for the electrical intermediate layer in the ferroelectric transistor.

In this context, it should be noted that the invention is not limited to the structure of the ferroelectric transistor described in the exemplary embodiment but that, for example, the structure of a ferroelectric transistor described by T. Nakamura et al. in the above-mentioned article "A Single-Transistor Ferroelectric Memory Cell," or described by Jong-Son Lyu et al. in the above-mentioned article "Metal-Ferroelectric-Semiconductor Field-Effect Transistor (MFSFET) for Single Transistor Memory by Using Poly-Si Source/Drain and $BaMgF_4$ Dielectric" can also be used without any problems within the scope of the invention.

Other features which are considered as characteristic for the invention are set forth in the appended claims.

Although the invention is illustrated and described herein as embodied in a method for reading and storing a state from or in a ferroelectric transistor in a memory cell, and a memory matrix, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
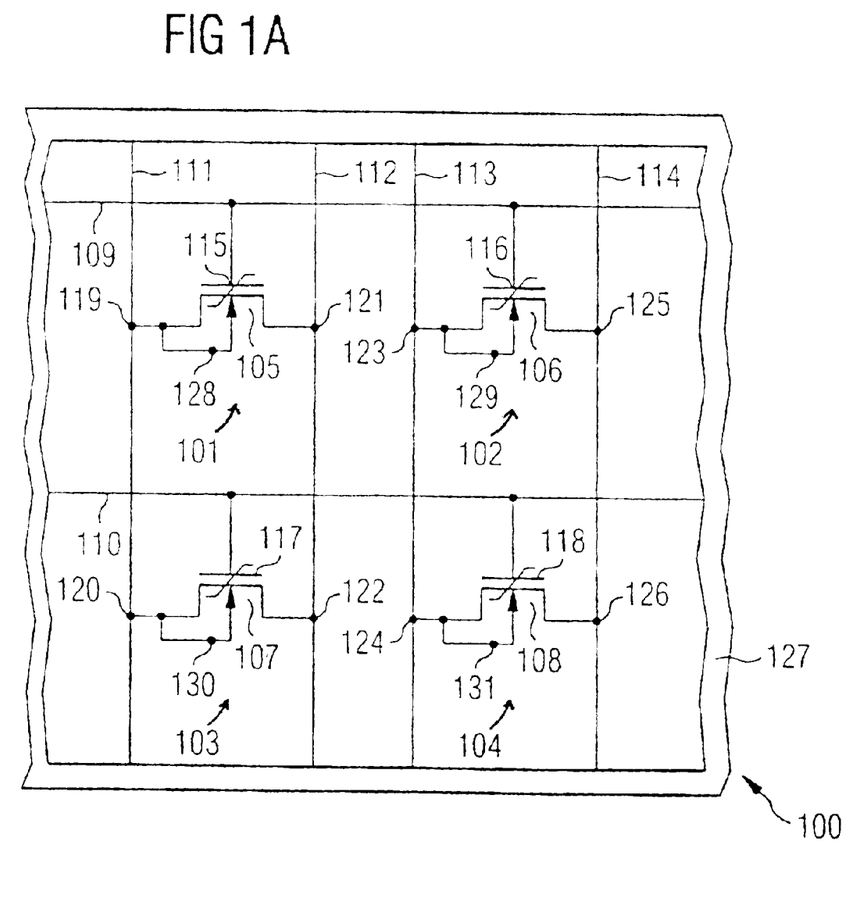
FIG. 1a is a partial schematic circuit diagram of a memory matrix having four memory cells, each having one ferroelectric transistor.

Referring now to the figures of the drawings in detail and first, particularly, to FIG. 1 thereof, there is shown a memory matrix 100 having four memory cells 101, 102, 103, 104.

Each memory cell 101, 102, 103, 104 has a ferroelectric transistor 105, 106, 107, 108. Furthermore, the memory matrix 100 has a first word line 109 and a second word line 110. Furthermore, the memory matrix 100 has a first bit line 111, a second bit line 112, a third bit line 113 and a fourth bit line 114.

The gate 115 of the first ferroelectric transistor 105 and the gate 116 of the second ferroelectric transistor 106 are coupled to the first word line 109.

The gate 117 of the third ferroelectric transistor 107 and the gate 118 of the fourth ferroelectric transistor 108 are coupled to the second word line 110.

The source 119 of the first ferroelectric transistor 105 and the source 120 of the third ferroelectric transistor 107 are coupled to the first bit line 111.

The drain 121 of the first ferroelectric transistor 105 and the drain 122 of the third ferroelectric transistor 107 are connected to the second bit line 112.

The source 123 of the second ferroelectric transistor 106 and the source 124 of the fourth ferroelectric transistor 108 are connected to the third bit line 113.

The drain 125 of the second ferroelectric transistor 106 and the drain 126 of the fourth ferroelectric transistor 108 are connected to the fourth bit line 114.

The word lines 109, 110 and the bit lines 111, 112, 113, 114 are connected to a read/store control apparatus 127.

The storing of a state of a ferroelectric transistor in the memory matrix 100 and the reading of a state of a ferroelectric transistor in the memory matrix 100 are controlled by the read/store control apparatus 127 by application of different voltages to the corresponding word lines 109, 110 and/or to the corresponding bit lines 111, 112, 113, 114, as will be explained in more detail in the following text.

Figure 3:
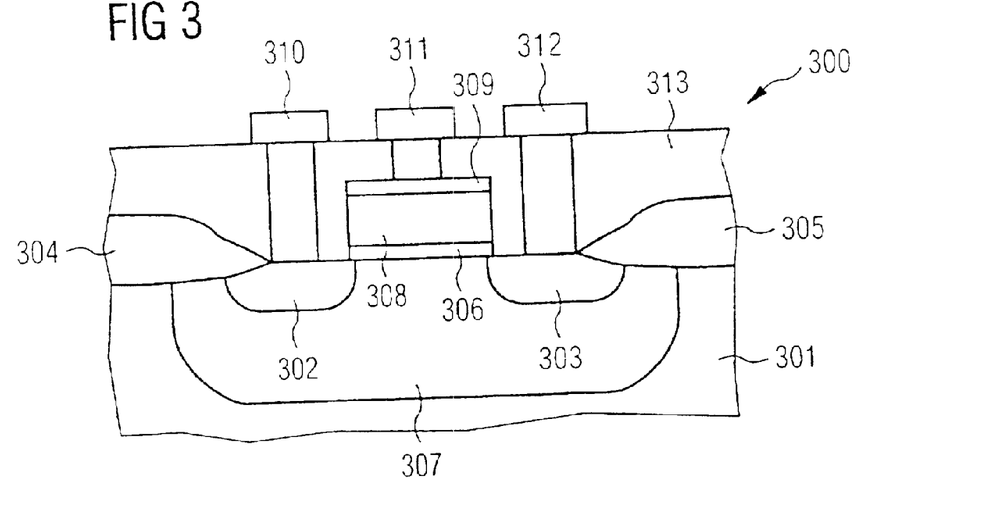
FIG. 3 is a diagrammatic, partial sectional view of a ferroelectric transistor according to an exemplary embodiment of the invention.

FIG. 3 shows a ferroelectric transistor 300, as is provided as the first ferroelectric transistor 105, as the second ferroelectric transistor 106, as the third ferroelectric transistor 107 and as the fourth ferroelectric transistor 108 in the memory matrix 100.

The ferroelectric transistor 300 has a p-doped substrate 301 composed of silicon, as well as a source region 302 and a drain region 303 adjacent to which two silicon regions 304, 305 are provided. These regions are deposited using a conventional CVD (Chemical Vapor Deposition) method. A dielectric intermediate layer 306, which is composed of silicon oxide, is then deposited over the channel region 307 between the source region 302 and the drain region 303 of the ferroelectric transistor 300. The dielectric intermediate layer 306 may alternatively also be composed of a different dielectric, for example $Al_2O_3$, $CeO_2$ or $ZrO_2$, which is applied, for example, with the aid of a CVD method.

A ferroelectric layer 308 which may contain SBT ($SrBi_2Ta_2O_9$) or PZT ($(Pb,Zr)TiO_3$) is then applied to this, for example with the aid of a CVD method.

The heat treatment of these two layers 306, 308 for producing the desired layer characteristics can be carried out in sequence, that is to say after the deposition of each individual layer but, alternatively,—if this is desired—it can be carried out in a step after the deposition of both layers 306, 308.

The dielectric intermediate layer 306 and the ferroelectric layer 308 are then structured through the use of an etching process.

If a metallic gate electrode 309 is used, then this is produced by a sputtering method, and is then structured through the use of an etching process. The metallic electrode can be used as a hard mask for structuring the layers located underneath it.

The source region 302 and the drain region 303 can be implanted in a self-adjusting manner to form the gate stack.

The rest of the process steps before and after the production of the ferroelectric gate stack can be carried out analogously to standard CMOS (Complimentary Metal Oxide Semiconductor) manufacturing methods.

Furthermore, the ferroelectric transistor 300 has contacts 310, 311, 312, which are conductively connected in a corresponding manner to the source 302, to the drain 303 and to the gate electrode 309.

In addition, the ferroelectric transistor 300 has a silicon planarization layer 313.

Figure 4:
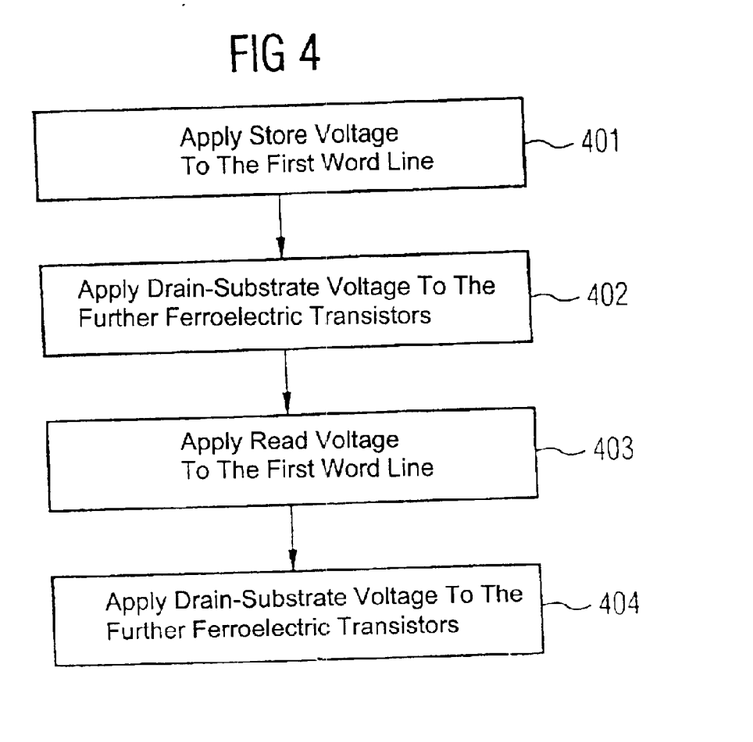
FIG. 4 is a flowchart illustrating the individual steps for reading or storing a state from or in a ferroelectric transistor according to an exemplary embodiment of the invention.

The reading and storing of a state in the first ferroelectric transistor 105 will be explained in more detail in the following text with reference to FIG. 4 and FIG. 1b.

In a first step (step 401), a store voltage $V_{pp}$, which is $V_{pp}=5$ V according to the exemplary embodiment, is applied to the first word line 109 in order to store a first state.

A voltage $V_{pp}/2$ or $V_{pp}/3$ is applied to the non-selected second word line 110, to the non-selected third bit line 113 and to the non-selected fourth bit line 114 via the gate of the respective further ferroelectric transistors.

A voltage of 0 V is applied to the first bit line 111 and to the second bit line 112.

At the same time as the application of the store voltage $V_{pp}$, a drain-substrate voltage $V_{DS}$ of $V_{DS}=+3.3$ V is applied to the further ferroelectric transistors 106, 107, 108, in order to protect them against an incorrect state change (step 402). In an alternative embodiment, the drain-substrate voltage $V_{DS}$=+3.3 V can be applied permanently to all the ferroelectric transistors in the memory matrix 100. The application of the drain-substrate voltage of $V_{DS}$=+3.3 V is illustrated in FIG. 1a through the use of voltage sources 128, 129, 130, 131 in the substrate of the respective ferroelectric transistor 105, 106, 107, 108.

In a further step (step 403), the state of the first ferroelectric transistor 105 is read by applying a read voltage $V_{rr}$ of $V_{rr}$=2.6 V to the first word line 109, and by applying a voltage $V_{ss}$ of $V_{ss}$=0.1 V to the second bit line 112.

If the read voltage is chosen to be greater than this, then, once again, in a further step (step 404), the drain-substrate voltage $V_{DS}$ of the further ferroelectric transistors 106, 107, 108 can be applied to the value of $V_{DS}$=+3.3 V at the same time as the read process in order to protect the further ferroelectric transistors 106, 107, 108. As stated above, in an alternative embodiment, the drain-substrate voltage of $V_{DS}$=+3.3 V can be applied permanently to all the ferroelectric transistors in the memory matrix 100.

The deletion of the first state in the first ferroelectric transistor 105, which can also be regarded as storage of a second state in the first ferroelectric transistor 105, is carried out by applying the store voltage $V_{pp}$ to the first bit line 111 and to the second bit line 112.

In this case, a voltage of 0 V is applied to the first word line 109. A preferably constant drain-substrate voltage $V_{DS}$ of $V_{DS}$=+3.3 V is once again applied in order to protect the further ferroelectric transistors 106, 107, 108.

Figure 1B:
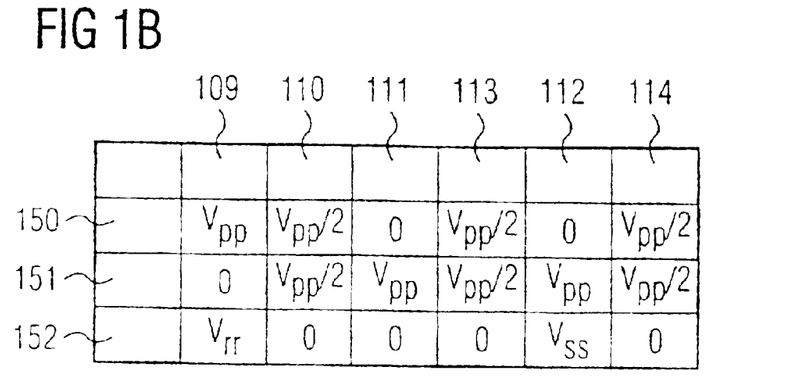
FIG. 1b is a table illustrating the corresponding voltages which are applied to the lines of the memory matrix when reading or storing a state in a memory cell according to an exemplary embodiment of the invention.

The various applied voltages for storing (see 150 in FIG. 1b) the first state in the first ferroelectric transistor 105, for storing (see 151 in FIG. 1b) the second state in the first ferroelectric transistor 105 and for reading (see 152 in FIG. 1b) the state from the first ferroelectric transistor 105 are shown in tabular form in FIG. 1b.

The increase in the threshold voltage of the ferroelectric transistor achieved by application of the appropriate drain-substrate voltage will be explained with reference to FIG. 5 and FIG. 6.

Figure 5:
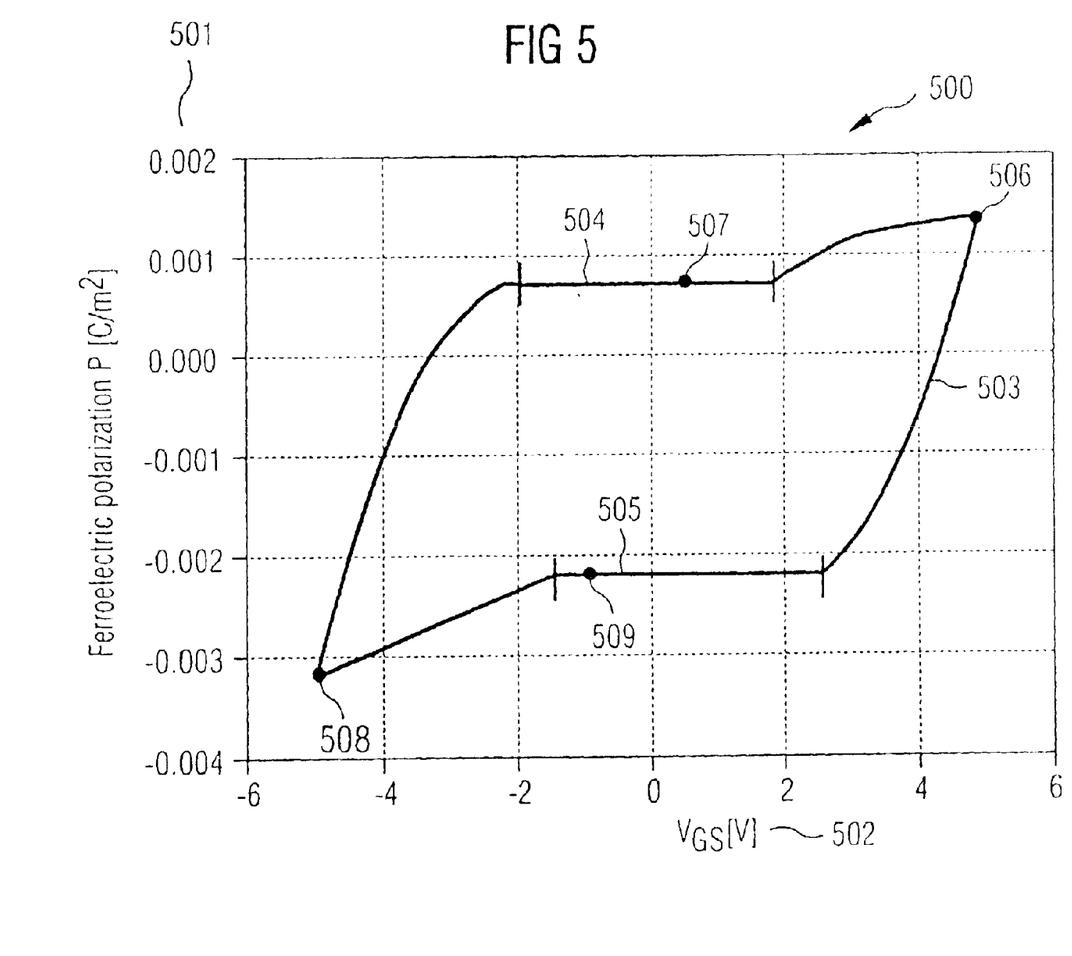
FIG. 5 is a graph illustrating the profile of the ferroelectric polarization in the gate of a usual ferroelectric transistor as a function of the applied gate voltage when reading or storing a state from or in the ferroelectric transistor according to an exemplary embodiment of the invention.

FIG. 5 shows the profile 500 of the ferroelectric polarization 501 at the gate of a ferroelectric transistor as a function of the gate voltage 502 with the increased ferroelectric transistor threshold voltage, achieved according to this exemplary embodiment by a temporary application or permanent application of a drain-substrate voltage in the respective further ferroelectric transistor 106, 107, 108 or to all the ferroelectric transistors in the memory matrix 100.

The resultant hysteresis loop 503 has two plateau regions 504, 505. If now, due to an interference voltage, the gate voltage $V_{GS}$ on a further ferroelectric transistor 106, 107, 108 is increased, which further ferroelectric transistor 106, 107, 108 is in a first state, indicated by a first distinguishable polarization state 506 in the hysteresis loop 503, then the application of the interference voltage results in the hysteresis loop 503 normally assuming only one polarization state in the first plateau region 504 provided the drain-substrate voltage is sufficiently high, the plateau being symbolized by a second distinguishable polarization state 507.

If the respective ferroelectric transistor is in a second state, as is indicated in the hysteresis loop 503 by a third distinguishable polarization state 508, and an interference voltage is applied, then, once again, provided a sufficiently high drain-substrate voltage is applied and the second plateau region 505 is thus sufficiently large, only one state is assumed, which is located in the second plateau region 505, symbolized by a fourth distinguishable polarization state 509.

Figure 6:
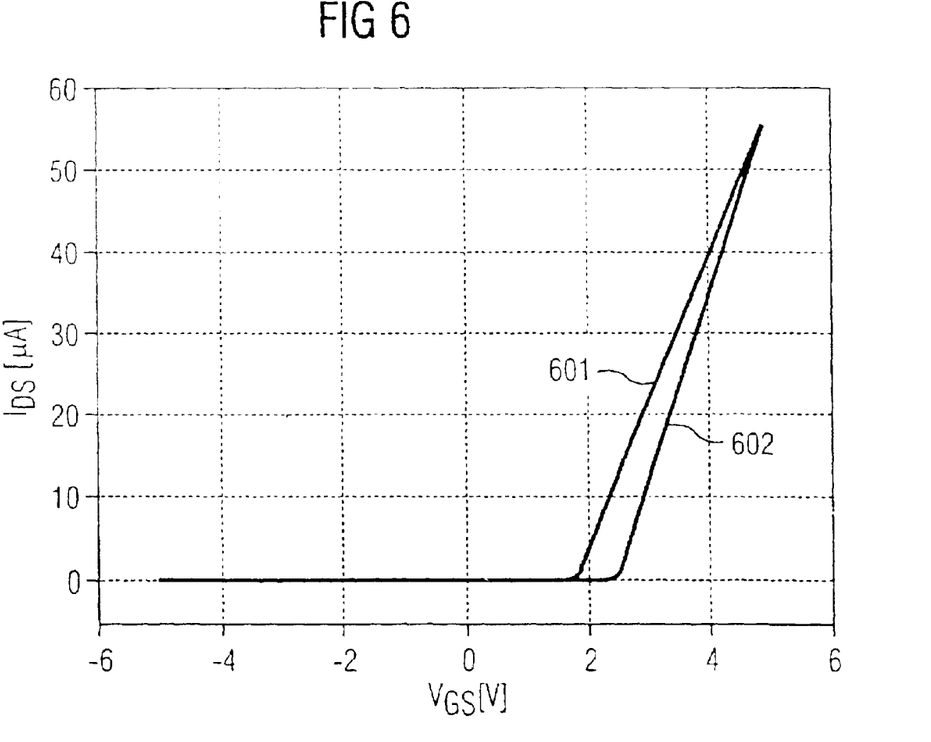
FIG. 6 is a graph illustrating an output characteristic of the ferroelectric transistor according to an exemplary embodiment of the invention.

As can be seen from FIG. 6, the second distinguishable polarization state 507 and the fourth distinguishable polarization state 509 can be distinguished from one another on the basis of the different output characteristics 601, 602 of the drain-source current $I_{DS}$ as a function of the gate voltage $V_{GS}$, since the first output characteristic 601 results for the second distinguishable polarization state 507, and the second output characteristic 602 results for the fourth distinguishable polarization state 509.

Thus, even the second distinguishable polarization state 507 which is assumed as a result of an interference voltage can still be distinguished electrically from any fourth distinguishable polarization state 509 which may be assumed due to an interference voltage.

The invention can thus be seen in that an application of a drain-substrate voltage changes the hysteresis loop of the corresponding ferroelectric transistor in such a manner that plateau regions are formed in the hysteresis loop, thus preventing the creation of undefined polarization states, which cannot be distinguished from one another electrically.

A number of alternatives relating to the exemplary embodiment described above are explained in more detail in the following text. The invention is not limited to the specific form of a memory matrix described above and, in particular, it is not limited to a memory matrix having four memory cells. The invention can be used with a memory matrix of any desired configuration and with any desired number of memory cells, that is to say with ferroelectric transistors as memory cells. Furthermore, a memory cell may also include a number of transistors, in particular a number of ferroelectric transistors.

We claim:

1. A memory configuration, comprising:
   a memory matrix including a plurality of memory cells connected to one another, said memory cells including ferroelectric transistors such that at least some of said memory cells each include at least a respective one of said ferroelectric transistors;
   a read/store control apparatus connected to said memory cells for controlling one of reading a state from one of said ferroelectric transistors and storing a state to said one of said ferroelectric transistors; and
   said read/store control apparatus being configured such that the state is one of read from said one of said ferroelectric transistors and stored in said one of said ferroelectric transistors, and such that a threshold voltage of at least a further one of said ferroelectric transistors in said memory matrix is increased by applying a drain-substrate voltage.

2. The memory configuration according to claim 1, wherein:
   said one of said ferroelectric transistors has a gate electrode; and
   said read/store control apparatus is configured such that a read voltage is applied to said gate electrode for reading the state from said one of said ferroelectric transistors.

3. The memory configuration according to claim 1, wherein:
   said one of said ferroelectric transistors has a gate electrode; and
   said read/store control apparatus is configured such that a store voltage is applied to said gate electrode for storing the state in said one of said ferroelectric transistors.

4. The memory configuration according to claim 1, wherein at least one of said memory cells in said memory matrix includes at least two transistors.

5. The memory configuration according to claim 1, wherein said read/store control apparatus is configured such that the threshold voltage of said further one of said ferroelectric transistors in said memory matrix is increased by applying a the drain-substrate voltage to said further one of said ferroelectric transistors in said memory matrix.

6. The memory configuration according to claim 5, wherein said read/store control apparatus is configured such that the drain-substrate voltage is substantially +3.3 volts.

7. The memory configuration according to claim 5, wherein said read/store control apparatus is configured such that the drain substrate voltage is substantially −3.3 volts.

8. The memory configuration according to claim 1, wherein the applied drain-substrate voltage forms a plateau in a hysteresis loop of said further one of said ferroelectric transistors to define a ferroelectric polarization profile.

* * * * *